United States Patent [19]

Bonnie

[11] 4,153,947
[45] May 8, 1979

[54] CONDUCTOR DRIVEN FIELD ACCESS MAGNETIC BUBBLE MEMORY PROPAGATION SYSTEM

[75] Inventor: G. Patrick Bonnie, Minneapolis, Minn.

[73] Assignee: Control Data Corporation, Minneapolis, Minn.

[21] Appl. No.: 841,507

[22] Filed: Oct. 12, 1977

[51] Int. Cl.² .............................................. G11C 19/08
[52] U.S. Cl. ............................................ 365/6; 365/2
[58] Field of Search ............................ 365/2, 6, 19, 20

[56] References Cited

U.S. PATENT DOCUMENTS 4,045,786  8/1977  Lee ............................................ 365/2

*Primary Examiner*—James W. Moffitt
*Attorney, Agent, or Firm*—William J. McGinnis, Jr.

[57] ABSTRACT

In a magnetic bubble memory device, an improvement to the means for providing an in-plane rotational magnetic field to advance bubbles through some appropriate, staged structural form of permalloy elements is a conductor overlay positioned so that the permalloy elements are generally oriented normally to current flow in the conductors. The conductor overlay may consist of two orthogonal groups of parallel wires or a single grid or mesh of wires with four electrical connections, one on each of four edges. The conductor overlay may be driven to produce an in-plane rotating magnetic field and the magnetic bubbles travel to or follow the induced poles in the permalloy elements just as if conventionally driven.

3 Claims, 4 Drawing Figures

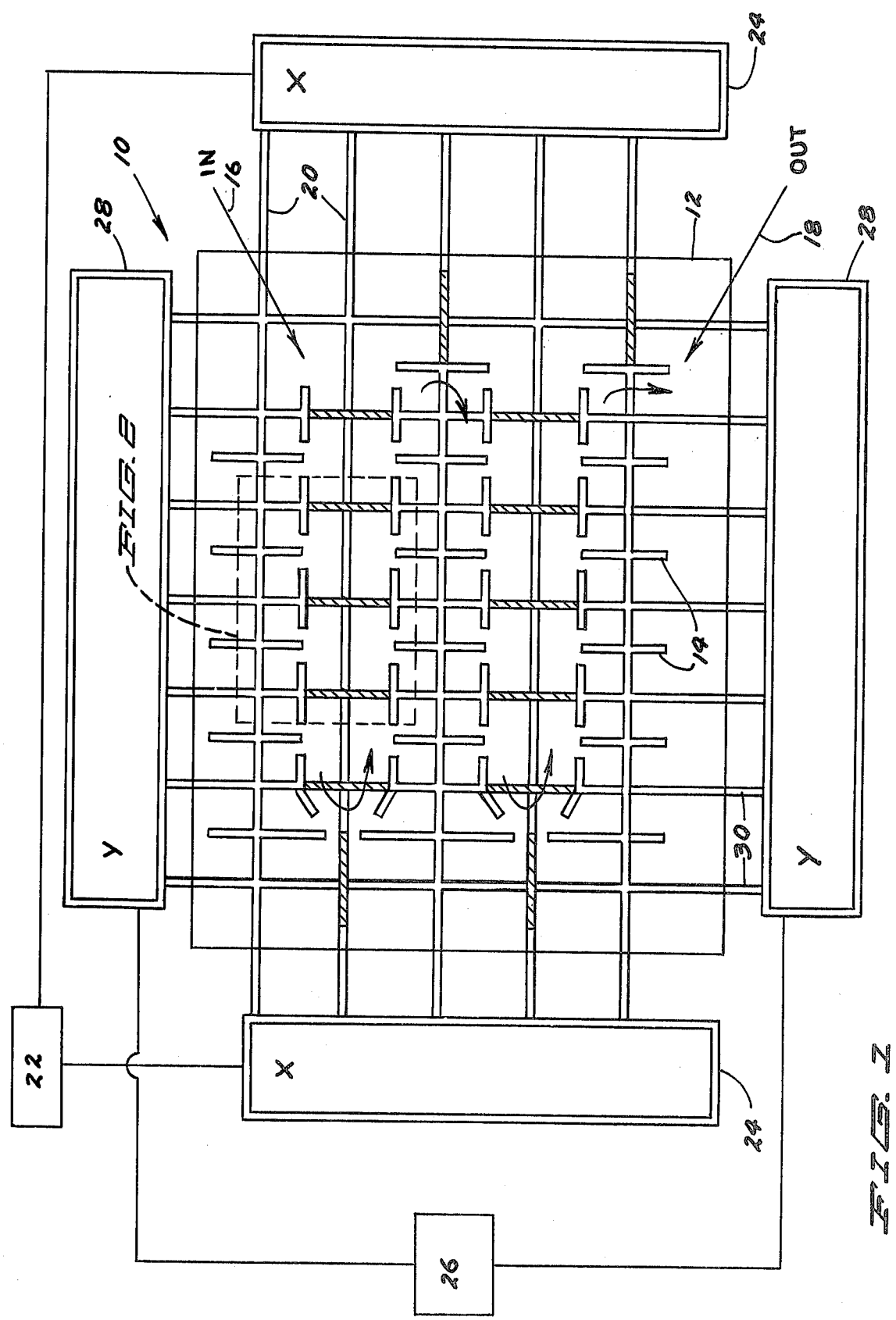

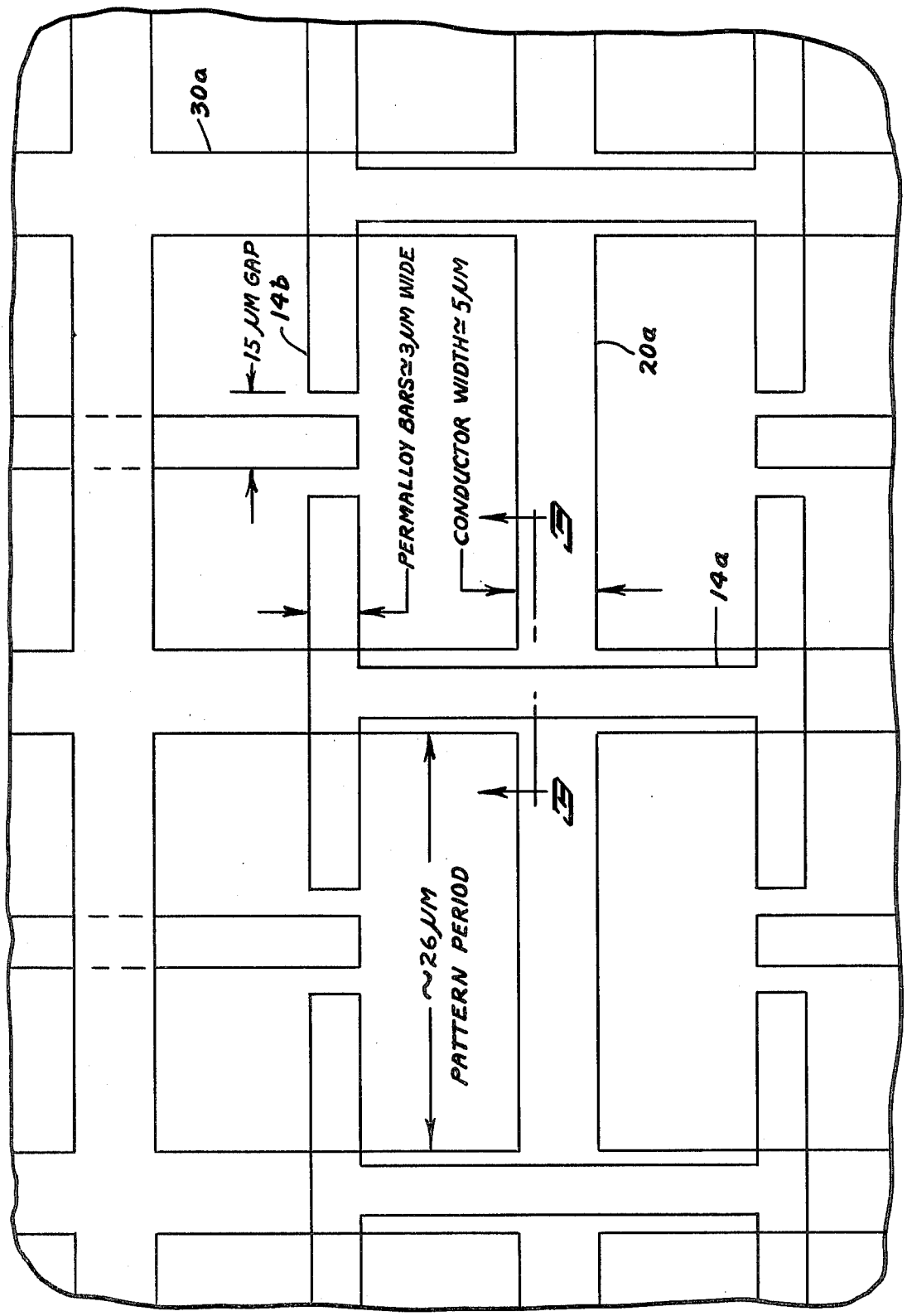

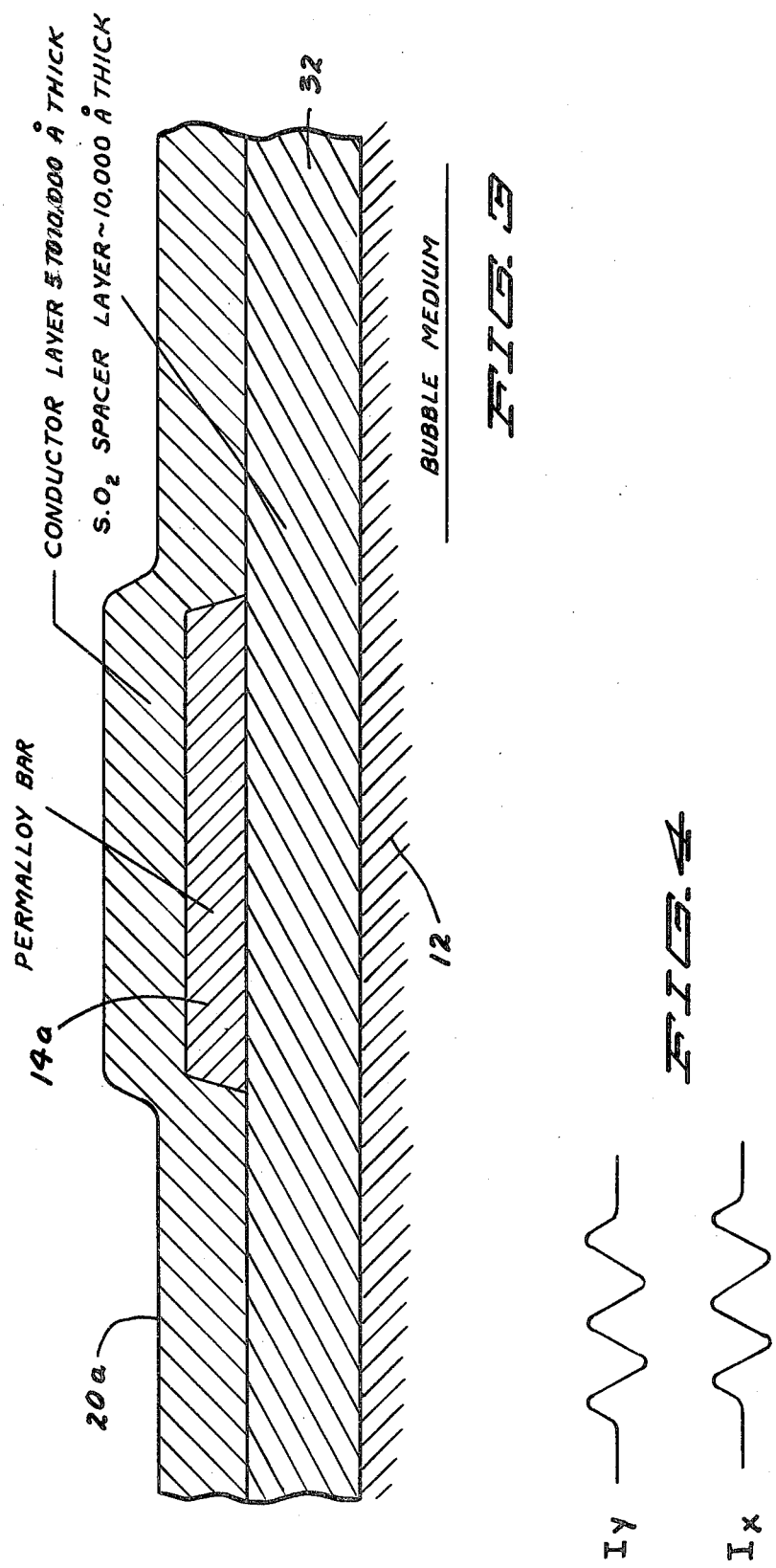

CONDUCTOR DRIVEN FIELD ACCESS MAGNETIC BUBBLE MEMORY PROPAGATION SYSTEM

BACKGROUND OF THE INVENTION

This invention relates generally to magnetic bubble memory devices and more particularly to a means for providing the rotating in-plane magnetic field for moving bubbles from one location to another in a field of memory elements.

The presently adopted method of propagating bubble domains in a bubble memory consists of a coil structure surrounding the bubble memory device which is electrically driven to produce the rotational in-plane field. Typically, the coil structure consists of a pair of coils, with one oriented towards an X axes and the other oriented towards a Y axes so that the two coils are fitted together. These coils typically add considerably to the power consumption and volume requirements for a given size bubble memory. The theory of such propagation systems is explained in an article entitled "Propagation of Cylindrical Magnetic Domains in Orthoferrites," by Anthony J. Perneski, IEEE TRANSACTIONS ON MAGNETICS, Volume Mag-5, Number 3, September 1969, pages 554 through 557. FIG. 2 in that article is generally illustrative of the type of coil structure required.

It would be desirable to have a means for generating an in-plane field for propagating magnetic bubbles which does not add significantly to the volume of the structure for a given size memory or add to the power requirement as significantly as the conventional coil structure now used. However, in the field access method of operating a bubble memory, the coil system for producing the rotating field has been the only satisfactory arrangement. It is noted, however, that the prior art also includes an effort at developing a conductor driven bubble propagation scheme. A description of the conductor driven bubble propagation scheme is contained in the article "Magnetic Bubbles" by Andrew H. Bobeck and H. E. D. Scovil, SCIENTIFIC AMERICAN, June 1971, pages 78 to 90. The conductor driven bubble propagation scheme consists of conductor loops placed directly over a magnetic wafer. Unlike the field access system there are no permalloy elements which act to contain or restrain the magnetic bubbles. The conductor loop driven system constrains the magnetic bubble within patterns formed on parallel conducting elements.

Problems with the prior art conducting loops are the extremely precise controls on spacing and shape of the conductors in order to provide a satisfactory memory. The advantage of the field access bubble memory system employing an externally generated rotating field with permalloy elements is that the only material which had to be placed on the magnetic substrate was the pattern of permalloy elements which could be much larger than the desirable bubble size. In contrast, the size and spacing of conductors in a prior art conductor access method required conductors to be of approximately the same size as the bubbles to be propagated.

SUMMARY OF THE INVENTION

This invention is an improvement in the propagation method for use in a field access bubble memory system. The conventional structure consisting of a magnetic substrate with an overlay of permalloy bars which relies on a rotating in-plane magnetic field for bubble propagation is provided with an overlay of an electrical conductor grid which provides the driving magnetic field to move bubbles from one permalloy element to another.

In a drive system according to the present invention, the conductors may be somewhat larger than the permalloy elements and the conductors need not be related directly to the bubble size of the magnetic domains being propagated. Because the conductor overlay has very low impedance, a considerable improvement in speed of cycling the bubble memory device may be obtained with respect to multi-twin coils presently used. The externally applied, coil driven in-plane magnetic field requires a field coil having a fairly substantial volume, thus creating an inductance which causes problems for high frequency operation of a bubble memory device. Further, because the permalloy elements are present in the conventional field access structure, the device according to the present invention is stable in a power-off condition.

An additional advantage is that the conductor overlay of the present invention may connect all conductors of a particular grid in the conductor overlay together at each edge of the panel allowing only one drive connection per edge of the memory device. The grid or mesh which may be composed of a single mesh with all wires connected together at intersections or two separate layers of orthogonally oriented parallel conductor layers may be driven in a coordinated fashion to produce a rotating field. The conductors are arranged over the permalloy elements so that the individual permalloy elements are oriented normal to the current flow in the conductors. Thus, the magnetic bubbles in the substrate follow the magnetic poles which are generated on the permalloy elements and do not directly follow the magnetic field of the electrical conductors. The permalloy elements magnetically couple the magnetic flux from the conductors to control bubble movement. Magnetic flux from the electrical conductors does not directly control bubble movement. Also, the conductor overlay is placed on top of the permalloy element layer so that the permalloy elements have a greater affect on the bubbles which are in the magnetic substrate than the conductors which are farther away. If the conductor overlay is formed as a single mesh consisting of orthogonal conductors arranged in parallel fashion in each direction and connected at intersections with precise interval spacing, then the problem of placing the conductor overlay on the permalloy element overlay becomes one of just a single initial placement rather than a problem of orienting individual conductors to individual strips of permalloy elements. It is believed that this provides a significant advantage to assembling this type of structure.

IN THE FIGURES

FIG. 1 is a top plan view of a bubble memory shift register according to the present invention in which the permalloy elements and the conductor overlay for a magnetic media is shown, FIG. 2 is a detailed view of a section of the shift register shown in FIG. 1, FIG. 3 is a cross sectional view taken along lines 3—3 of FIG. 2, and FIG. 4 is a schematic showing of one current wave form required to drive the conductor overlay shown in FIG. 1 to produce a rotating magnetic field for moving bubble memory elements.

DESCRIPTION OF THE PREFERRED EMBODIMENTS

Referring now to FIG. 1, an embodiment of a magnetic bubble memory shift register 10 according to the present invention is shown. Register 10 is shown illustratively as a 22 position of element device. A magnetic substrate 12 of conventional material for bubble memory devices is provided as the foundation on which the remainder of the structure is constructed. A pattern of permalloy bar elements 14 forms the structure which controls the flow of magnetic bubbles in the register.

Elements 14 are shown illustratively as T-Bars and straight bars, but this invention is suitable for use with permalloy elements of different shapes. The manner in which the field access method of driving bubbles in a bubble memory device is well known and will not be described here further. Generally, it is understood that the bubbles in the presence of the rotating magnetic field pass in stages from one permalloy element to another. It is sufficient to say, for the purpose of describing this invention, that by conventional means bubbles are placed at the input of the shift register shown schematically by arrow 16 and the bubbles are withdrawn from the register at the arrow 18 by means which may be of conventional design for receiving bubbles.

The conductor overlay according to the present invention is shown as consisting of a group of five electrical conductors parallel to one another passing over the permalloy bar structure from left to right in the X direction. The individual conductors 20 are connected with current generating means 22 which in turn is connected to an X axis bus 24 on both sides of the magnetic chip substrate 12 on which the register is constructed. Similarly, a Y axis current generator 26 is connected to bus 28 on either side of the substrate 12 which in turn is connected to, in this example, seven Y axis conductors 30. Thus, in the presence of a conventional bias magnetic field, bubbles which are introduced into the shift register at 16 will pass through the 22 stages of the shift register and emerge at the exit location 18 having been driven stage by stage through the permalloy elements of the register. The X axis current generator 22 and the Y axis current generator 26 will be driven, for example, with a triangular wave current signals in such a fashion that a rotating magnetic field is produced in the plane of the magnetic substrate 12 where the bubbles exist.

Referring now to FIG. 2, a detailed showing of a portion of FIG. 1 shows generally the size and element relationships of the structure of FIG. 1 as an example of the practice of the present invention. Generally, the permalloy bars may be approximately 3 micrometers wide, while the conductors generally may be approximately 5 micrometers wide where the proposed bubble size for this particular structure is to be approximately 6 micrometers. It is contemplated in this structure that the permalloy bars would be approximately 1-½ micrometers spaced apart from each other at junctions designed to pass bubbles from one bar to the next. The permalloy bars would be approximately four-tenths of a micrometer thick. The permalloy features repeat one another at a spacing of approximately 26 micrometers as does the spacing of the X and Y axis electrical conductors. While shown to be approximately 5 micrometers in width, the conductors, according to this embodiment of the invention, may be in the range of 3 micrometers to 5 micrometers in width.

Although these dimensions are given merely as an example and not by way of limitation, it is known that a tenfold increase or decrease in scale of the structure would still constitute an operable structure. In order to achieve the desired current density in order to generate the appropriate magnetic field, the conductors would be in the range of ½ to 1 micrometer thick. The appropriate current required in the electrical conductors would be in the range of 10 to 20 milliampere per conductor. It can be seen that a particular X axis conductor 20a passes normally over a particular permalloy element 14a so that this conductor when carrying current can energize the poles of that particular element to influence the location of a magnetic bubble passing through the register. Similarly, it can be seen that a particular Y axis conductor 30a normally with respect to particular portions of the permalloy bars 14b so that when conducting current the magnetic pole portions of the permalloy bars may be affected.

Referring now to FIG. 3 which is a cross sectional view taken along lines 3—3 of FIG. 2, the bubble medium 12 forming the substrate is shown schematically. The permalloy elements are fixed to a conventional spacer layer 32 which is approximately 10,000 Angstroms thick. A single portion of a permalloy bar 14a is shown on top of the spacer layer 32. The conductor layer shown is a longitudinal cross section of a portion of the X access conductors 20a which nominally is 5,000 to 10,000 Angstroms thick passing over the permalloy element. FIG. 3 is schematic and is not intended to show the actual thickness relationships of the different structures.

Referring now to FIG. 4, the current relationship for the X access and Y access conductors is shown with respect to time for producing the proper rotational drive field for moving a magnetic bubble through the shift register shown in FIG. 1. The waveform shown is generally representative of a sine wave. However, it is certainly possible to use triangle waves or a pulsed current drive in proper sequence to create a rotating drive field. Note that conductor inductance is comparatively low and fast rise and fall times are possible for the current drive so that applied power can be reduced significantly compared to prior art coil systems.

The drive scheme described herein may be used as the exclusive drive system for a bubble memory. Alternatively, the present conductor driven field access system may be combined with a conventional coil driven system to achieve certain advantages. In such an application the conductor grid would cover only a selected area of a chip and remain dormant while the conventional rotational field provided drive for the chip. Then, during a pause in the conventionally driven field, the conductor driven portion of the chip could be driven at high frequency to cause a specific operation on that portion of the chip while the remainder of the chip was stable. For example such a system would be used for low power loading of a chip with a serial-parallel-serial arrangement of data where serial loading was dominant but with special provision for parallel elements for data.

What is claimed is:

1. In a magnetic bubble memory device comprised of a magnetic substrate and a layer of material over said substrate having magnetic elements positioned thereon, the improvement comprising:

means for producing a magnetic field rotating in the same plane as the substrate and interacting with said magnetic elements consisting of a first plurality of conductors parallel to one another positioned directly over said magnetic elements and a second plurality of conductors parallel to one another and orthogonal to said first plurality of conductors positioned directly over said magnetic elements all of said conductors having electrical terminations at each end so that current may be passed therethrough, and means for providing a varying electrical current to said second plurality of conductors in an out of phase relationship to the current provided to said first plurality of conductors so that a rotational magnetic field is produced in the plane of the substrate.

2. The structure of claim 1 wherein all of said orthogonal conductors are joined at intersections with one another.

3. The structure of claim 1 wherein said conductors are arranged with respect to said magnetic elements so that one conductor from said first plurality and one conductor from said second plurality crosses over each magnetic element.

* * * * *